(12) United States Patent
Yan et al.

(10) Patent No.: US 8,961,693 B2
(45) Date of Patent: Feb. 24, 2015

(54) COMPONENT SUPPORTING DEVICE

(75) Inventors: Maocheng Yan, Shenzhen (CN); Hsiangyin Shih, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 829 days.

(21) Appl. No.: 13/254,166

(22) PCT Filed: Aug. 3, 2011

(86) PCT No.: PCT/CN2011/077955
§ 371 (c)(1),
(2), (4) Date: Aug. 31, 2011

(65) Prior Publication Data
US 2012/0313308 A1    Dec. 13, 2012

(51) Int. Cl.
*C23C 16/00* (2006.01)
*B25B 11/00* (2006.01)
*H01J 37/32* (2006.01)
*H01L 21/67* (2006.01)

(52) U.S. Cl.
CPC ......... *B25B 11/005* (2013.01); *H01J 37/32935* (2013.01); *H01L 21/67109* (2013.01)
USPC ............................................ 118/728; 269/21

(58) Field of Classification Search
CPC ........... B25B 11/00; H01J 37/00; H01L 21/00
USPC .......................... 269/21, 20, 900, 903, 289 R
See application file for complete search history.

(56) References Cited

U.S. PATENT DOCUMENTS

| | | | | |
|---|---|---|---|---|
| 7,695,590 | B2 * | 4/2010 | Hanawa et al. | 118/723 E |
| 8,558,460 | B2 * | 10/2013 | Nonomura et al. | 315/111.21 |
| 2006/0130767 | A1 * | 6/2006 | Herchen | 118/728 |

* cited by examiner

*Primary Examiner* — Lee D Wilson
*Assistant Examiner* — Seahee Yoon
(74) *Attorney, Agent, or Firm* — Mark M. Friedman (57) ABSTRACT

The present invention provides a component supporting device which has: a platform, a vacuum system, a gas supply system and a discharger system. The platform has a supporting surface, a bottom surface and at least one through hole, and the through hole passes through the supporting surface and the bottom surface. The vacuum system provides a vacuum suction to the through hole. The gas supply system is used to output at least one type of gas to the through hole. The discharger system ionizes the gas into an ion fluid. Thus, the through hole can be used to provide the vacuum suction for supporting and sucking a component, or to provide the ion fluid when releasing the vacuum suction for more efficiently, uniformly and rapidly removing static electricity on a surface of the component.

14 Claims, 6 Drawing Sheets

Fig. 1A

Prior Art

Fig. 1B

Prior Art

Fig. 1C

Prior Art

COMPONENT SUPPORTING DEVICE

CROSS REFERENCE TO RELATED APPLICATIONS

The present application is a 35 U.S.C. §371 National Phase conversion of International (PCT) Patent Application No. PCT/CN2011/077955, filed on Aug. 3, 2011, the disclosure of which is incorporated by reference herein. The PCT International Patent Application was filed in Chinese.

FIELD OF THE INVENTION

The present invention relates to a component supporting device, and more particularly to a component supporting device capable of removing static electricity on the surface thereof.

BACKGROUND OF THE INVENTION

During processes of making liquid crystal displays (LCDs), plasma display panels (PDPs) and semiconductors, there are frequently a plurality of static electricity phenomena accompanied with the processes, result in damages or defects of product. The main harm of products caused by the static electricity is electro-static damages (ESD) and electro-static attractions (ESA). The electro static damage means that static electricity discharges to cause lattice damages and transistor breakdowns, and the electro static attraction means that the static electricity is used to the attachment of fine dusts. The two electro-static problems generally happen at the same time and result synergistic damages to products, so that a yield of products is sharply dropped, and thus the manufacture cost of products are increased.

Figure 1A:
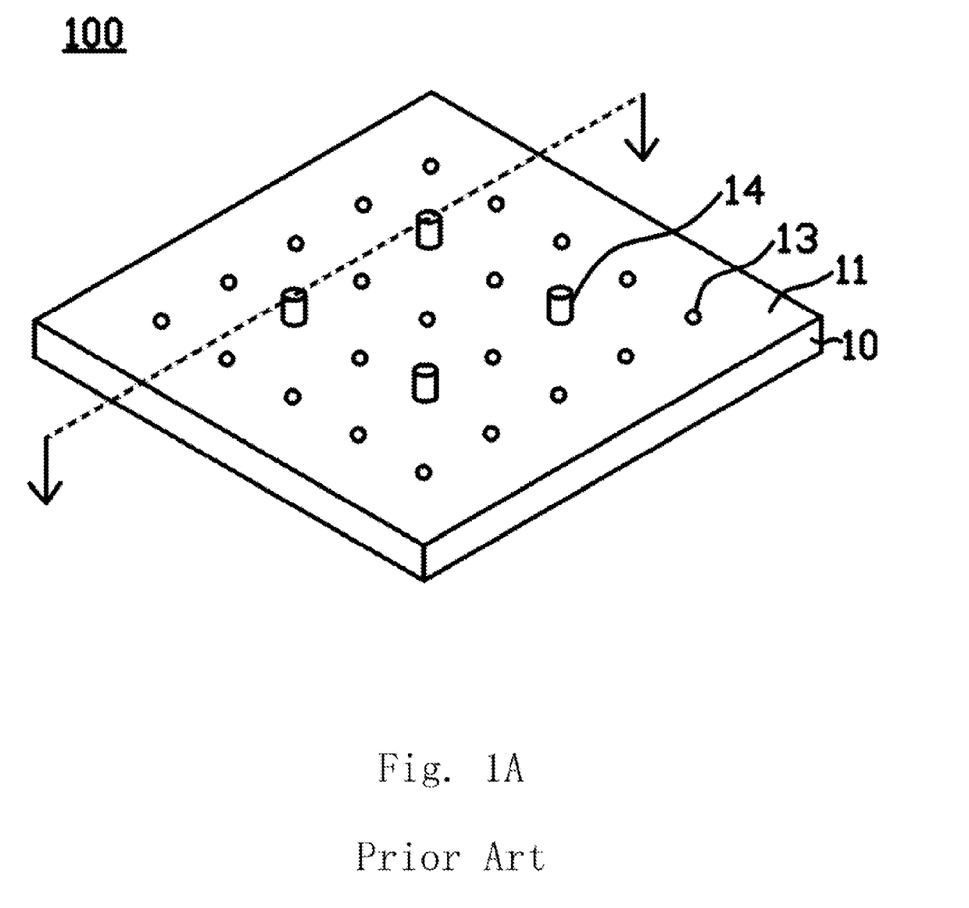
FIG. 1A is a schematic view of a platform of a traditional first processing apparatus for a substrate.

Referring to FIG. 1A, a schematic view of a platform 10 of a traditional first substrate-processing apparatus 100. The platform 10 is used to support the substrate 40 (shown in FIG. 1C) and to position the substrate 40 for carrying out the following processes. The platform 10 mainly comprises a supporting surface 11, a bottom surface 12, a plurality of through holes 13 and a plurality of pins 14, wherein the through holes 13 pass through the platform 10 from the supporting surface 11 to the bottom surface 12.

Figure 1B:
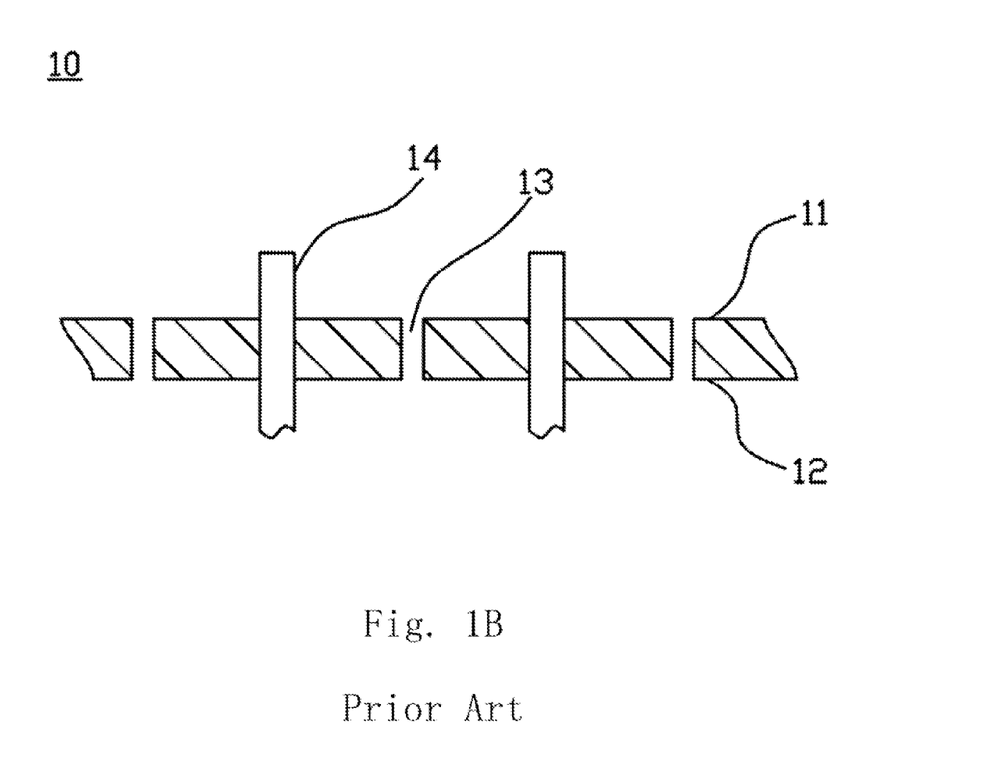
FIG. 1B is a cross-sectional view of the platform, taken along the line A-A in FIG. 1A.

Referring to FIG. 1B, a cross-sectional view of the platform 10, taken along the line A-A in FIG. 1A. During the processes, the first substrate-processing apparatus 100 firstly causes the pins 14 to extend outward from the supporting surface 11, wherein a carrying arm (not-shown) is used to place the substrate 40 onto the pins 14 at this moment, and then the pins 14 return back into the platform 10, so that the substrate 40 can be horizontally placed on the supporting surface 11 of the platform 10.

Figure 1C:
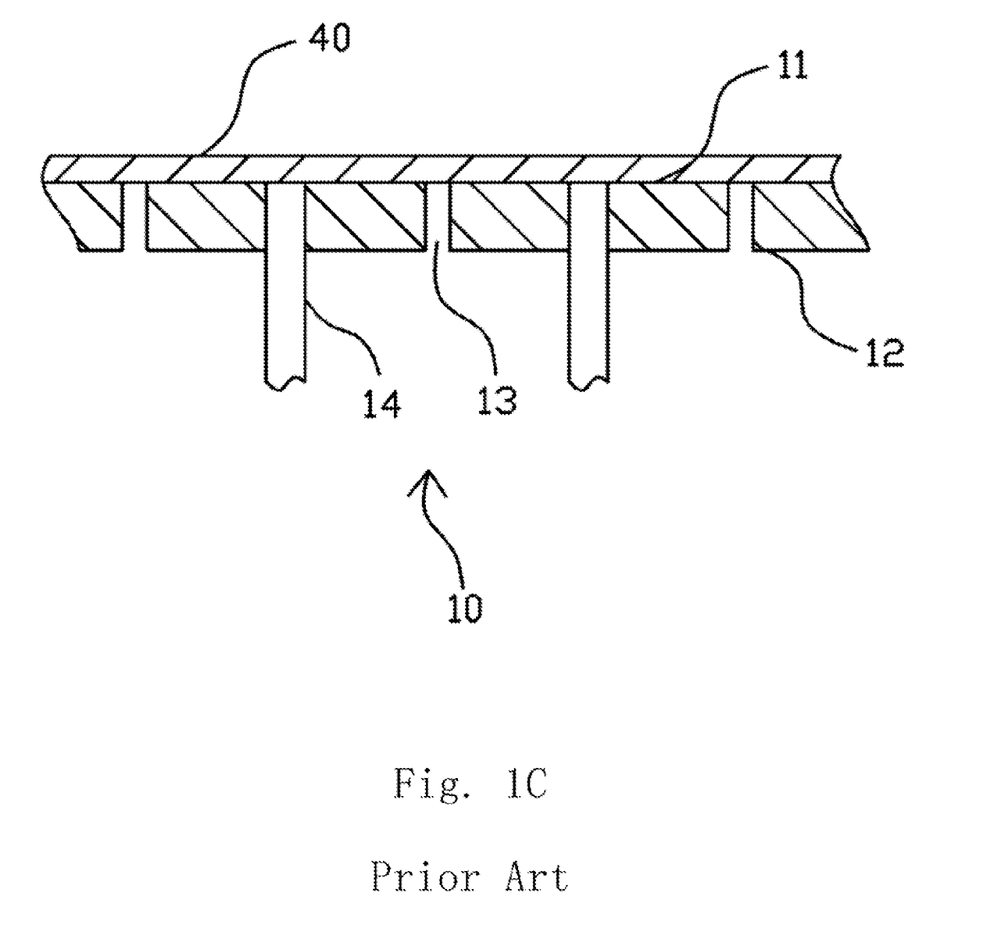
FIG. 1C is a cross-sectional view of the substrate to be placed on the platform in FIG. 1B.

Referring to FIG. 1C, a cross-sectional view of the substrate 40 placed on the platform 10 in FIG. 1B, after the substrate 40 is placed on the supporting surface 11, it also has a process to check the position for ensuring if the substrate 40 is placed on a correct position. After this, vacuuming the through holes 13 for fixedly holding the substrate 40 on the supporting surface 11, and then performing processes to the substrate 40 (such as coating an alignment film on a glass substrate). Once the processes are finished, the vacuum of the through holes 13 is broken, and the pins 14 extend outward from the supporting surface 11 again to elevate the substrate 40. The carrying arm is then used to take away the substrate 40, and thus the processes of the substrate can be done. However, during the above processes, the substrate 40 and the platform 10 may perform motions of contacting and separating. At the moment of separating the substrate 40 from the platform 10, it is easy to generate considerable strip-static and frictional static, and thus a potential difference may be arisen between the substrate 40 and the supporting surface 11. If the static electricity cannot be immediately removed from the substrate 40, the substrate 40 will easy be harmed by the static electricity.

Figure 2:
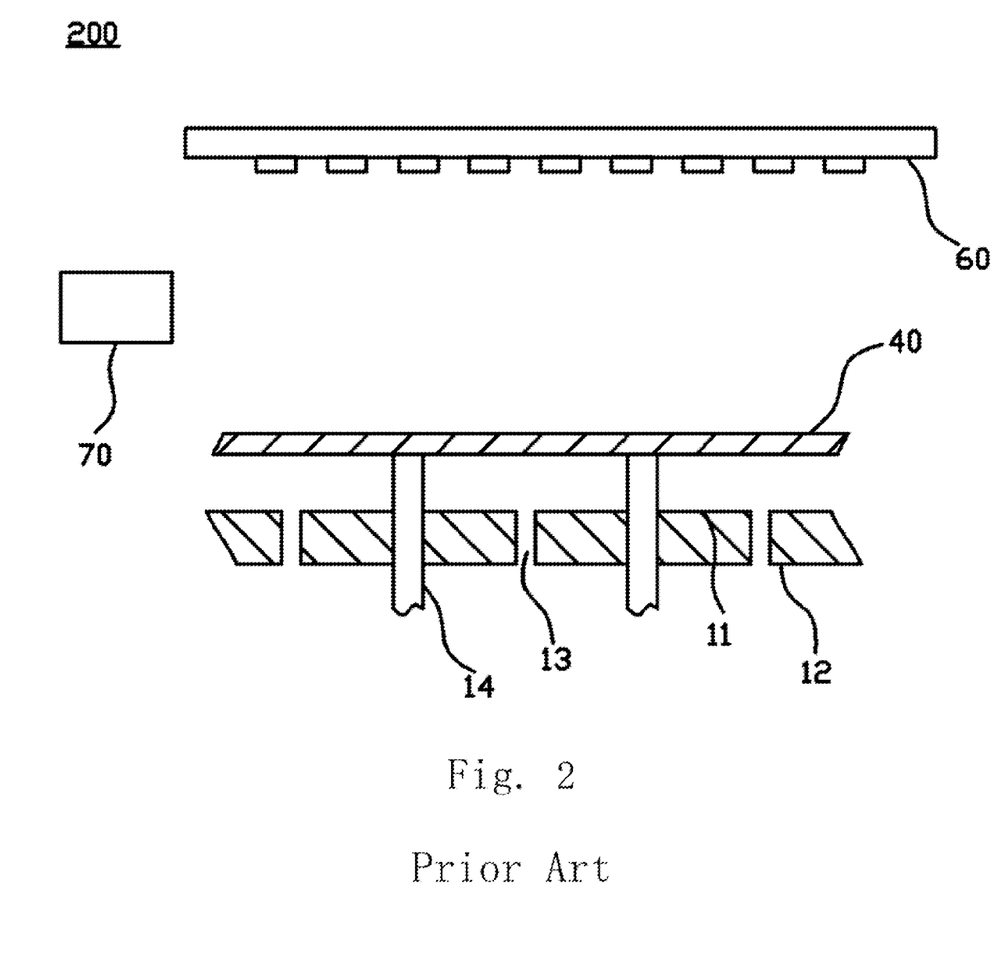
FIG. 2 is a cross-sectional view of a traditional second processing apparatus for the substrate.

Referring to FIG. 2, a cross-sectional view of a traditional second substrate-processing apparatus 200. In order to solve the electrostatic problem, a traditional method is to install an ionizing fan bar 60 and/or an X-ray device 70 on the second substrate-processing apparatus 200, wherein the ionizing fan bar 60 is placed above the substrate 40, and the ionizing fan bar 60 removes the static electricity by corona discharges, wherein it uses a tip of a discharging probe (non-shown) to discharge for generating ion wind with a plurality of charged ions, and the charged ions are blown onto the substrate 40 to help the charged ions and the static electricity to achieve a charge neutralization effect. The X-ray device 70 is placed on a side of the substrate 40 and uses soft x-rays to remove the static electricity. It mainly uses the soft X-rays to ionize the gases near the substrate 40, and then neutralize the static electricity on a surface of the substrate 40 by the ionized gases.

Specifically, as shown in FIG. 2, the ionizing fan bar 60 is generally formed with a plurality of tips of the discharging probes, and the whole volume thereof is large with a small efficient range for removing the static electricity. It only can be disposed on the top or side of the apparatus for removing the nearby static electricity. However, as to the considerable static electricity generated due to the suddenly separation of the substrate 40 from the platform 10, the ion wind of the ionizing fan bar 60 cannot reach the bottom surface of the substrate 40 and cannot efficiently rapidly remove the static electricity. As to the X-ray device 70, there are disadvantages of high apparatus prices, harmful risk of X-rays to people, ionic disequilibrium of the surrounding environment easily occurred after removing the static electricity and so on, it is hard to be widely used in electronic industries. Besides, the soft X-rays generated by the X-ray device 70 are easy to be absorbed by the air, and cannot pass through the substrate 40. At the moment of separating the substrate 40 from the platform 10, the gases between the substrate 40 and the supporting surface 11 are difficult to be ionized, so that the static electricity on the substrate 40 is still hard to be removed, so that the substrate 40 is still then broken by the static electricity.

As a result, it is necessary to provide a processing apparatus which enable to efficiently remove the static electricity for components to solve the electrostatic problems in the conventional technology.

SUMMARY OF THE INVENTION

An object of the present invention is to provide a component supporting device, wherein a processing apparatus is provide for the components to remove static electricity to solve the electrostatic problems in the conventional technology.

A primary object of the present invention is to provide a component supporting device, which comprises a platform, a vacuum system, a gas supply system and a discharger system. The platform has a supporting surface, a bottom surface and at least one through hole, and the through hole is formed between the supporting surface and the bottom surface; the vacuum system provides a vacuum suction to the through hole; the gas supply system is used to output at least one type of gas to the through hole; the discharger system ionizes the gas into an ion fluid; wherein the through hole is used to provide the vacuum suction for supporting and sucking a component, or to provide the ion fluid when releasing the vacuum suction for removing static electricity on a surface of the component. Thus, the component supporting device can more efficiently, uniformly and rapidly remove the static electricity on the surface of the component.

A secondary object of the present invention is to provide a component supporting device, which comprises a platform, a vacuum system, a gas supply system and a discharger system. The platform has a supporting surface, at least one through hole and a plurality of pins. The through hole is formed on the supporting surface, and the pins are stored in the platform or extended out from the supporting surface; the vacuum system provides a vacuum suction to the through hole; the gas supply system outputs at least one type of gas by a pressure; and the discharger system has at least one discharge tube and a power supply. The discharge tube discharges the gas to be ionized into an ion wind; a power supply is used to provide an electric signal to the discharge tube, wherein the through hole is used to provide the vacuum suction for supporting and sucking a component, or to provide the ion fluid when releasing the vacuum suction for removing static electricity on a surface of the component. The discharger system continuously monitors for decreasing an ionization degree of the gas when the static electricity on the surface of the component is continuously reduced, so as to ensure to stop generating the ion fluid after the static electricity on the surface of the component is removed. Thus, it will not cause redundant ion fluid to be accumulated on the component.

A third object of the present invention is to provide a component supporting device, wherein the gas supply system comprises a gas supply, a conduit and a sieve. The conduit is connected to the bottom surface and the through hole, and the sieve disposed between the gas supply and the through hole is used to filter the gas. It not only can help the gas which passed through the sieve to become clearer for generating purer ion fluid, but also can filter dusts or impurities outputted from the gas supply. Thus, it is helpful to ensure that there will be no electrostatic particles or dusts remained on the surface of the component.

To achieve the above object, the present invention provides a component supporting device, which comprises a platform, a vacuum system, a gas supply system and a discharger system. The platform has a supporting surface, a bottom surface and at least one through hole, and the through hole is formed between the supporting surface and the bottom surface; the vacuum system provides a vacuum suction to the through hole; the gas supply system is used to provide at least one type of the gas to the through hole; the discharger system ionizes the gas into an ion fluid, wherein the through hole is used to provide the vacuum suction for supporting and sucking a component, or to provide the ion fluid when releasing the vacuum suction for removing static electricity on a surface of the component.

Moreover, the present invention provides a component supporting device, which comprises a platform, a vacuum system, a gas supply system and a discharger system. The platform has a supporting surface, at least one through hole and a plurality of pins. The through hole is formed on the supporting surface and the pins are stored in the platform or extended out from the supporting surface; the vacuum system provides a vacuum suction to the through hole; the gas supply system outputs at least one type of gas by a pressure; and the discharger system has at least one discharge tube and a power supply. The discharge tube discharges the gas to be ionized into an ion wind; a power supply is used to provide an electric signal to the discharge tube, wherein the through hole is used to provide the vacuum suction for supporting and sucking a component, or to provide the ion fluid when releasing the vacuum suction for removing static electricity on a surface of the component.

In one embodiment of the present invention, the discharger system comprises at least one discharge tube ionizing the gas into the ion fluid with a plurality of positive or negative ions; a power supply providing an electric signal to the discharge tube; and a monitor, wherein when the component is placed on the pins, the monitor monitors a charge type of a discharge end and a potential difference between the discharge end and the component, so as to modulate the electric signal.

In one embodiment of the present invention, the electric signal is an AC signal pulse.

In one embodiment of the present invention, the discharge tube comprises a discharge end which is disposed in the through hole, and the discharge end ionizes the gas into the positive or negative ions according to the electric signal.

In one embodiment of the present invention, the vacuum system comprises a vacuum generator, at least one first conduit and a first valve. The vacuum generator is used to generate the vacuum suction; the at least one first conduit is connected to the through hole; and the first valve is located between the first conduit and the through hole.

In one embodiment of the present invention, the gas supply system comprises: a gas supply for outputting the gas; at least one second conduit which is connected to the through hole; a second valve which is located between the second conduit and the through hole; and at least one sieve which has a plurality of sieve pores and is disposed between the gas supply and the second valve.

In one embodiment of the present invention, the gas supply system outputs the gas with a pressure of 0.5 MPa, and an aperture of the sieve pores is 0.01 μm.

In one embodiment of the present invention, a diameter of the through hole is 4 millimeter, and a hole wall of the through hole is coated with a silicone layer.

In one embodiment of the present invention, the platform further comprises a plurality of pins which are stored in the platform or stuck out from the supporting surface.

In one embodiment of the present invention, the component is a glass substrate of a semi-finished product of liquid crystal display (LCD).

Comparing to the existing technology, the component supporting device in the present invention can more efficiently, uniformly and rapidly remove the static electricity on the surface of the components, and also can continuously monitor at the same time for decreasing an ionization degree of the gas when the static electricity on the surface of the components is continuously reduced, so as to ensure to stop generating the ion fluid after the static electricity on the surface of the components is removed, and then to stop providing the ion fluid. Thus, it will not cause redundant ion fluid accumulated on the components and can ensure that there will be no electrostatic particles or dusts remained on the components, and thus a yield of the product thereof can be achieved.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

The present invention is to provide a component supporting device which is mainly applied to the field of insulator processes, and more particularly to the field of processes for semiconductor or optoelectronic products. It is mainly used to remove static electricity on a surface of the component that is generated at an instant of separating a component from a platform, so as to prevent the component from being damaged by the static electricity in the following processes.

Figure 3:
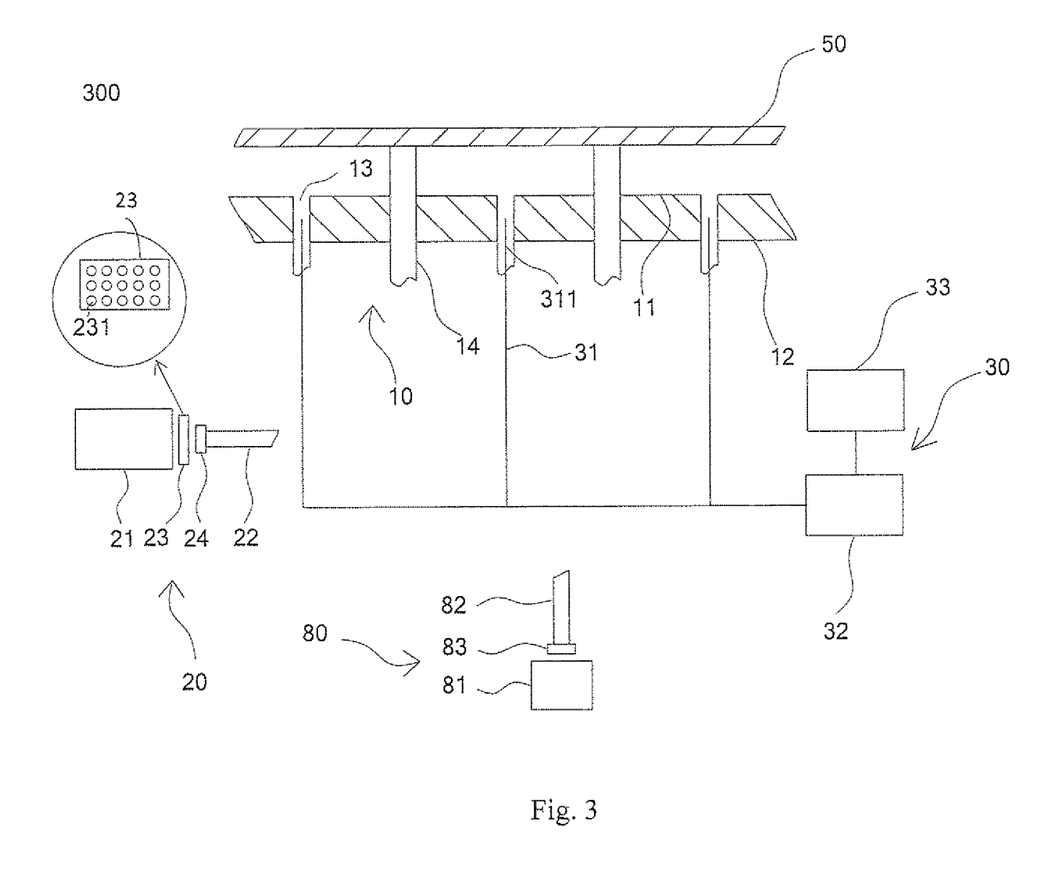
FIG. 3 is a cross-sectional view of a component supporting device according to a preferred embodiment of this present invention.

Referring to FIG. 3, a cross-sectional view of a component supporting device 300 according to a preferred embodiment of this present invention, wherein the supporting apparatus of the components 300 is mainly comprises a platform 10, a gas supply system 20, a discharger system 30 and a vacuum system 80 for processing a component 50. The foregoing components of the present invention will be described more detailed hereinafter.

Figure 3A:
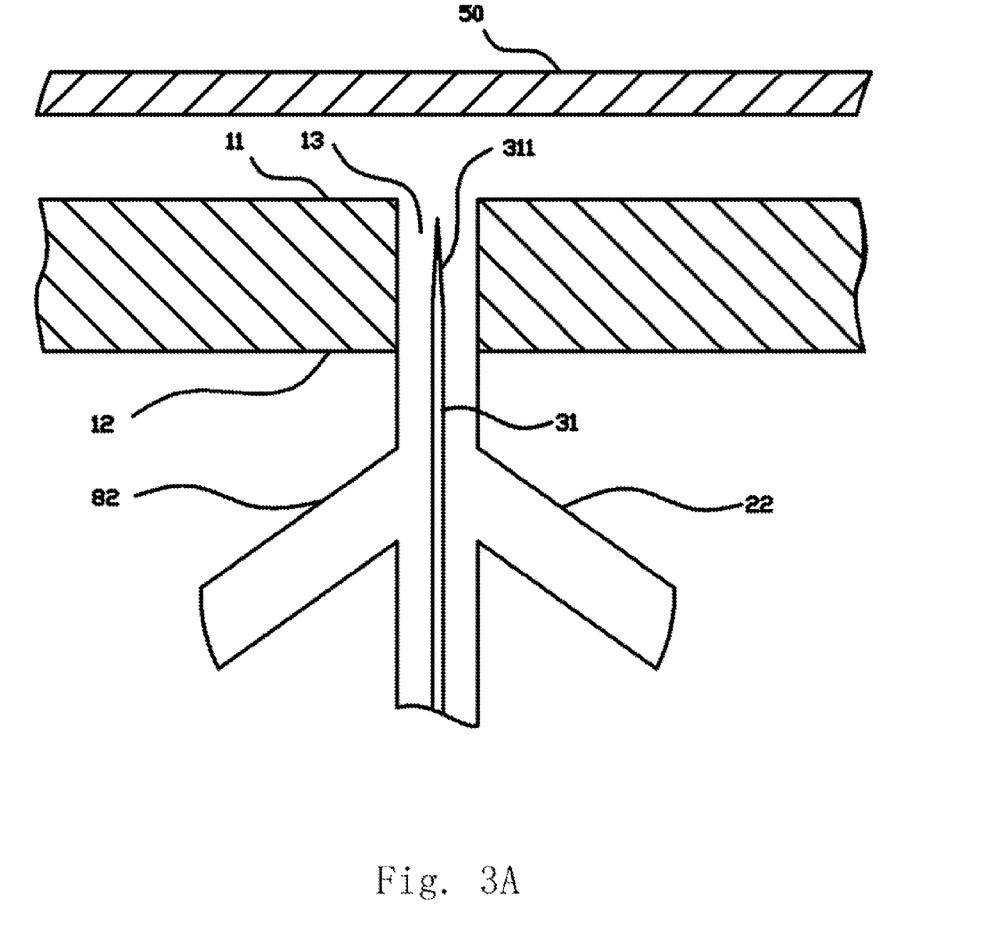
FIG. 3A is a partially enlarged view of the supporting apparatus of the components according to the present invention.

FIG. 3A is a partially enlarged view of the supporting apparatus of the components 300 according to the embodiment of the present invention. Referring to FIGS. 3 and 3A, the supporting apparatus of the components 300 according to the first embodiment of the present invention may be a processing apparatus for a glass substrate of a liquid crystal display (LCD). The component 50 may be a processed element or a substrate, and the platform 10 may be a processing platform for coating an alignment film, but it is not limited thereto. The platform 10 also can be a platform for processing any insulating materials, semiconductor substrates or optoelectronic products. The platform 10 comprises a supporting surface 11, a bottom surface 12 and at least one through hole 13, wherein the through hole 13 passes through the supporting surface 11 and the bottom surface 12, but it is not limited thereto. The through hole 13 also can pass through the supporting surface 11 and at least one side surface of the platform 10. Practically, if a length, a width and a height of the component 50 is 1300 mm, 1100 mm and 0.7 mm, respectively, the platform 10 may be uniformly formed with thirty of the through holes 13 with a diameter of 4 mm and twenty-five of the through holes 13 with a diameter of 4 mm corresponding to the length and the width thereof, respectively, but the present invention is not limited thereto. Besides, the platform 10 also can comprise a plurality of ejection pins 14, which are movably stored in the platform 10 and can be extended outward from the supporting surface 11 if necessary.

Referring to FIGS. 3 and 3A again, the vacuum system 80 is used to provide a vacuum suction to the through hole 13 for supporting and attracting the component 50. The vacuum system 80 comprises a vacuum generator 81, a plurality of first conduits 82 and a first valve 83, wherein the conduits 82 are located between the vacuum generator 81 and the through hole 13. The first conduits 82 are connected to boundaries of the through holes 13 and the supporting surface 11, so that the vacuum generator 81 can exhaust gases in the through hole 13, and therefore the through hole 13 may become vacuum. The first valve 83 is located between the vacuum generator 81 and the through hole 13 for controlling the vacuum suction of the vacuum generator 81, which is provided for the through hole 13.

As to FIGS. 3 and 3A, the gas supply system 20 provides a plurality of clean and dry gases for the through hole 13 with a pressure to release the vacuum in the through hole 13. The gas supply system 20 comprises a gas supply 21, a plurality of second conduits 22, at least one sieve 23 and a second valve 24, wherein the gas supply 21 outputs the gases according to the pressure. The second conduits 22 are located between the gas supply 21 and the through hole 13, and the second conduits 22 are connected to boundaries of the through holes 13 and the bottom surface 12. The second valve 24 is located between the second conduits 22 and the through hole 13 for receiving and controlling the gases come from the gas supply 21, so that the gases are delivered to the through holes 13 via the second conduits 22. The sieve 23 has a plurality of sieve pores 231 for cleaning the gases which pass through thereof; and the sieve 23 is disposed between the gas supply 21 and the through hole 13. Moreover, the pressure may be 0.5 MPa, and an aperture of the sieve pores 231 may be 0.01 μm, but it is not limited thereto.

As to FIGS. 3 and 3A again, the discharger system 30 is used to excite the gases, so that the gases are ionized into an ion fluid with a plurality of positive ions or negative ions. Base on the gas supply system 20, the gases are outputted according to the pressure, the ion fluid becomes an ion wind to remove static electricity on the surface of the component 50. The discharger system 30 comprises at least one discharge tube 31, a power supply 32 and a monitor 33. The discharge tube 31 comprises a discharge end 311, and the discharge end 311 is disposed in the through hole 13. The power supply 32 provides an electric signal for the discharge end 311 which may have point discharges in the through hole 13 according to the electric signal, and thus the gases are ionized into the ion fluid and then are blown from the through hole 13 to the component 50 in a form of the ion wind. The monitor 33 is used to watch a charge type of the discharge end 311 and a potential difference between the discharge end 311 and the component 50 for computing an electric quantity and an charge type of the component 50, and thereby modulating the electric signal of the power supply 32 according to the electric quantity and the charge type of the component 50. Thus, the discharge end 311 can generate the ion wind with an electric quantity that is equal to the electric quantity of the component 50 and with an charge type which is contrary to the charge type of the component 50, wherein the discharge end 311 may be disposed at an axis of the through hole 13. The discharge tube 31 may be a conductive discharge probe, and the discharge end 311 is a tip of the discharge probe. The electric quantity may be a net electric quantity of the static electricity of the surface of the component 50. The electric signal may be an AC signal pulse. Besides, a hole wall of the through hole 13 also may be coated with a silicone layer to protect the hole wall form being corroded by ozone generated from discharging of the discharge end 311.

Specifically, also referring to FIGS. 3 and 3A, after the pins 14 are extended outward from the supporting surface 11, a carrying arm (not-shown) will place the component 50 onto the pins 14, and then the pins 14 slowly return back into the platform 10, so that the component 50 can be placed on the supporting surface 11. However, the component 50 may directly be placed on the supporting surface 11 when the pins 14 are stored in the platform 10. Then, the component 50 is aligned to ensure a correct position for the component 50, and the vacuum system 80 is used to exhaust gases in the through hole 13 to be a vacuum condition, and thus the component 50 will be tightly fitted on the supporting surface 11. Thereafter, it may print an alignment film or execute surface processes to the component 50, but it is not limited thereto. After finishing processes of the component 50, the gases are delivered to the second conduits 22 by the gas supply system 20, and then the discharger system 30 is turned on. Once the gases pass through the discharge end 311, a portion of the gases will be ionized into the electrons or the ions, and then mixed with un-ionized gases into the ion wind. At this time, because the ion wind is flowed into the through hole 13, the through hole 13 will return to the state of the atmosphere from the vacuum state. Thus, it is helpful for the pins 14 to lift up the component 50, so as to cause the component 50 to be separated from the supporting surface 11. It should be noted that the ion wind not only helps the through hole 13 to return to the atmospheric state for easily separating the component 50 from the platform 10, but also more importantly, the component supporting device 300 can use the ions with the positive charges in the ion wind or the electrons with the negative charges to blow onto the component 50, so that the static particles dispersed on the surface of the component 50 and the ion wind will be electrically neutralized.

Moreover, also as to FIGS. 3 and 3A, after finishing processes of the component 50 and before moving the component 50 away from the pins 14, the gas supply system 20 still continuously outputs the gases, and the discharger system 30 continuously ionizes the gases. During the period, the monitor 33 also continuously monitors the charge type of the discharge end 311 and the potential difference between the discharge end 311 and the component 50 and modulates the AC signal pulse, so that the discharge end 311 can generate the ion wind with the equally charge quantity and the contrary electrode in relation to the component 50.

As to FIGS. 3 and 3A, the advantages of the foregoing features of the embodiment of the present invention are that: the component supporting device 300 removes the static electricity of the component 50 by the platform 10, the gas supply system 20 and the discharger system 30, and exhausts the gases in the through hole via the vacuum system 80. It mainly uses the gas supply system 20 to output the gases according to the pressure and ionizes the gases into the ion wind which comprises the electrons or the ions by the discharge end 311 disposed in the through hole 13. In addition, the gas supply system 20 continuously outputs the gases according to the pressure, so that the ion fluid blows onto the surface of the component 50 in the form of the ion wind for charge neutralization on the component 50. Thus it can be more efficient, more uniform and faster for the purpose of removing the static electricity. Moreover, when the component 50 is disposed on the pins 14, the monitor 33 will monitor the charge type of the discharge end 311 and the potential difference between the discharge end 311 and the component 50, and then correspondingly modulating the AC signal pulse of the electric signal to ensure the component supporting device 300 can provide the ion fluid which has the equally charge quantity and the contrary electrode in relation to the static electricity which accumulates on the surface of the component 50. Furthermore, because of the monitor 33 keeps monitoring, the monitor 33 synchronously modulates the AC signal pulse once the static electricity on the surface of the component 50 continuously decreases, so as to ensure to stop providing the ion fluid after the static electricity on the surface of the component 50 is removed, so that there will not excess ion fluid accumulated on the component 50. Besides, the second conduits 22 of the gas supply system 20 are connected to the boundary of the through hole 13 and the supporting surface 11, and the gases are filtered by the sieve 23 which is installed between the gas supply 21 and the through hole 13. It not only can help the gases to pass the sieve pores 231 to be more clear for generating purer ion fluid, but also can filter the dust or impurities outputted from the gas supply 21. Thus, it is helpful to ensure that there are no electrostatic particles or dusts remained on the component 50 for the purpose of improving the product yield.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A component supporting device, characterized in that: the component supporting device comprises:
    a platform having a supporting surface and at least one through hole, and the through hole being formed on the supporting surface;
    a vacuum system providing a vacuum suction to the through hole, the vacuum system comprising: a vacuum generator providing the vacuum suction; at least one first conduit connected to the through hole; and a first valve disposed between the first conduit and the through hole;
    a gas supply system outputting at least one type of gas to the through hole, the gas supply system comprising: a gas supply outputting the gas; at least one second conduit connected to the through hole; a second valve disposed between the second conduit and the through hole; and at least one sieve having a plurality of sieve pores and disposed between the gas supply and the second conduit; and
    a discharger system discharging the gas to ionize the gas into an ion fluid, the discharger system comprising: at least one discharge tube ionizing the gas into the ion fluid with a plurality of positive or negative ions; a power supply providing an electric signal to the discharge tube; and a monitor, wherein the monitor monitors a charge type of a discharge end of the discharge tube and a potential difference between the discharge end and a component, thereby modulating the electric signal;
    wherein the through hole provides the vacuum suction to support and suck the component, or to provide the ion fluid when releasing the vacuum suction, so as to remove static electricity on a surface of the component.

2. The component supporting device according to claim 1, wherein the electric signal is an AC signal pulse.

3. The component supporting device according to claim 1, wherein the discharge end of the discharge tube is disposed in the through hole, and the discharge end ionizes the gas into the positive or negative ions according to the electric signal.

4. The component supporting device according to claim 1, wherein a diameter of the through hole is 4 mm.

5. The component supporting device according to claim 1, wherein a hole wall of the through hole is coated with a silicone layer.

6. The component supporting device according to claim 1, wherein the platform further comprises a plurality of pins which are stored in the platform or extended outward from the supporting surface.

7. A component supporting device, wherein the component supporting device comprises:
a platform having a supporting surface and at least one through hole, and the through hole being formed on the supporting surface;
a vacuum system which comprises at least one first conduit connected to the through hole, a first valve located between the first conduit and the through hole, and a vacuum generator used for providing a vacuum suction to the through hole;
a gas supply system which comprises at least one second conduit connected to the through hole, a second valve disposed between the second conduit and the through hole, a gas supply used for outputting at least one type of gas to the through hole, and at least one sieve having a plurality of sieve pores and disposed between the gas supply and the second valve; and
a discharger system ionizing the gas into an ion fluid;
wherein the through hole provides the vacuum suction to support and suck a component, or to provide the ion fluid when releasing the vacuum suction, so as to remove static electricity on a surface of the component.

8. The component supporting device according to claim 7, wherein the discharger system comprises:
at least one discharge tube ionizing the gas into the ion fluid with a plurality of positive or negative ions;
a power supply providing an electric signal to the discharge tube; and
a monitor, wherein the monitor monitors an electrode of a discharge end and a potential difference between the discharge end and the component, thereby modulating the electric signal.

9. The component supporting device according to claim 8, wherein the electric signal is an AC signal pulse.

10. The component supporting device according to claim 8, wherein the discharge end of the discharge tube is disposed in the through hole, and the discharge end ionizes the gas into the positive or negative ions according to the electric signal.

11. The component supporting device according to claim 7, wherein a diameter of the through hole is 4 mm.

12. The component supporting device according to claim 7, wherein a hole wall of the through hole is coated with a silicone layer.

13. The component supporting device according to claim 7, wherein the platform further comprises a plurality of pins which are stored in the platform or extended outward from the supporting surface.

14. A component supporting device, wherein the component supporting device comprises:
a platform having a supporting surface, at least one through hole and a plurality of pins, the through hole being formed on the supporting surface, the pins being stored in the platform or extended outward from the supporting surface;
a vacuum system which comprises at least one first conduit connected to the through hole, a first valve located between the first conduit and the through hole, and a vacuum generator used for providing a vacuum suction to the through hole;
a gas supply system which comprises at least one second conduit connected to the through hole, a second valve disposed between the second conduit and the through hole, a gas supply used for outputting at least one type of gas according to a pressure, and at least one sieve having a plurality of sieve pores and disposed between the gas supply and the second valve; and
a discharger system comprising:
at least one discharge tube ionizing the gas into an ion fluid; and
a power supply providing an electric signal to the discharge tube; and
wherein the through hole provides the vacuum suction to support and suck the component, or to provide the ion fluid when releasing the vacuum suction, so as to remove static electricity on a surface of the component.

* * * * *